United States Patent
Cho

(10) Patent No.: US 6,559,549 B1
(45) Date of Patent: May 6, 2003

(54) TAPE CARRIER PACKAGE AND METHOD OF FABRICATING THE SAME

(75) Inventor: Hyoung Soo Cho, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/585,439

(22) Filed: Jun. 2, 2000

(30) Foreign Application Priority Data

Feb. 23, 2000 (KR) .......................................... 2000-08668

(51) Int. Cl.[7] .......................................... H01L 23/048
(52) U.S. Cl. ........................ 257/797; 257/678; 257/787; 257/680
(58) Field of Search ................................ 257/678, 685, 257/680, 699, 787, 797; 438/15, 666

(56) References Cited

U.S. PATENT DOCUMENTS

| | | | | |
|---|---|---|---|---|
| 5,221,858 A | * | 6/1993 | Higgins | 257/666 |
| 6,018,196 A | * | 1/2000 | Noddin | 257/777 |
| 6,084,291 A | * | 7/2000 | Fujimori | 257/668 |
| 6,104,619 A | * | 8/2000 | Shigehiro | 361/749 |
| 6,127,196 A | * | 10/2000 | Butera | 438/15 |

FOREIGN PATENT DOCUMENTS

| | | | |
|---|---|---|---|
| JP | 403225934 A | * | 10/1991 |
| JP | 2000010060 | | 1/2000 |

* cited by examiner

Primary Examiner—Wael Fahmy
Assistant Examiner—Nathan W. Ha
(74) Attorney, Agent, or Firm—McKenna Long & Aldridge LLP

(57) ABSTRACT

A tape carrier package with a widow that is capable of confirming an alignment extent between the tape carrier package and a print wiring board in bonding the tape carrier package mounted with an integrated circuit on the liquid crystal panel and the print wiring board. In the package, the integrated circuit is mounted onto a base film. Input pads are connected to the integrated circuit and formed on the base film. Dummy pads are formed at the left and right side thereof not to be connected to the integrated circuit. Windows are provided by opening the base film adjacent to the dummy pads to expose at least two of said dummy pads.

25 Claims, 6 Drawing Sheets

TAPE CARRIER PACKAGE AND METHOD OF FABRICATING THE SAME

BACKGROUND OF THE INVENTION

This application claims benefit of Korean patent application number P2000-0866, filed Feb. 23, 2000, which is hereby incorporated by reference for all purposes as if fully set forth herein.

1. Field of the Invention

This invention relates to a tape carrier package for mounting an integrated circuit and a liquid crystal display containing the same, and more particularly to a tape carrier package with a window through which an alignment between the tape carrier package and a printed wiring board can be confirmed with the naked eye.

2. Description of the Related Art

Generally, an active matrix liquid crystal display uses thin film transistors (TFTs) as switching devices to display a natural-looking moving picture. Since such a liquid crystal display device can be made into a smaller-size device than a cathode ray tube, it is commercially viable for use as a monitor such as a portable television or a lap-top personal computer or other consumer device.

The active matrix liquid crystal display displays a picture corresponding to video signals such as television signals on a pixel (or picture element) matrix having pixels arranged at each intersection between gate lines and data lines. Each pixel includes a liquid crystal cell for controlling a transmitted light quantity in accordance with a voltage level of a data signal from a data line. A TFT (thin film transistor) is installed at an intersection between a gate line and a data line to switch a data signal to be transferred to the liquid crystal cell in response to a scanning signal (i.e., a gate pulse) from the gate line.

Such a liquid crystal display requires a number of integrated circuits (ICs) connected to the data lines and the gate lines to apply data signals and scanning signals to the data lines and the gate lines, respectively. The ICs are installed between the printed wiring board (PWB) and the liquid crystal panel to apply signals supplied from the PWB to the data lines and the gate lines. IC mounting methods include chip on board, hereinafter referred to as "COB", tape automated bonding, hereinafter referred to as "TAB", and chip on glass, hereinafter referred to as "COG". (Other methods are also possible). The COB system is mainly used for a monochromatic liquid crystal display having a pixel pitch of more than 300 μm. As shown in FIG. 1, in this COB system, ICs 8 are mounted on a PWB 6 and a heat-seal connector 10 connects the PWB 6 and a glass substrate 3 in a liquid crystal panel 2. In this case, a back light unit 4 used as a light source is provided between the liquid crystal panel 2 and the PWB 6. As shown in FIG. 2, in the TAB system, ICs 14 are mounted on a tape carrier package (TCP) 12. The TCP 12 is connected between the PWB 6 and the liquid crystal panel 3. As shown in FIG. 3, in the COG system, an IC chip 20 is directly mounted on a glass substrate 17 in a liquid crystal panel 16

The above-mentioned TAB IC mounting method has been widely employed because it can widen an effective area of the panel and has a relatively simple mounting process.

As shown in FIG. 4, the TCP 12 employed in the TAB system includes a base film 22 on which is mounted an IC 14. The base film 22 is also provided with input and output pads 24 and 26 connected to input and output pins of the IC 14. The input and output pads 24 and 26 are fixed with the base film 22 by an adhesive layer 16 coated on the rear surface of the base film 22. The input and output pads 24 and 26 have a two-layer structure in which copper(Cu) is plated with tin(Sn) for preventing oxidation. As shown in FIG. 5A, the input pads 24 of the base film 22 are connected, via an anisotropic conductive film (ACF) 28, to pads 32 on a PWB 34. Likewise, the output pads 26 of the base film 22 are connected, via the ACF 30, to data/gate pads on the liquid crystal panel 2.

FIG. 5A and FIG. 5B illustrate a process of adhering the TCP to the PWB with the ACF 28. The input pads 24 are adhered to the bare film 22 by a bonding layer 16 coated on the base film 22. Conductive particles are coated on the ACF 28. The TCP 12 and the PWB 34 are adhered to each other by applying a certain pressure at a desired temperature after the ACF 28 has been coated. As shown in FIG. 5B, the conductive particles 30 coated on the ACF 28 are connected between the input pads 24 and a wiring 32 of the PWB 34 after the adhesion of the TCP 12 to the PWB 34 to form a current path.

Because the base film 22 has a low light transmissivity which adhered to the PWB, it is impossible to confirm an alignment state between the input pads and the wiring of the PWB. Accordingly, significantly bad alignments may be produced in the process of adhering the TCP to the PWB. Also, since the liquid crystal panel made from a glass transmits light even after the adhesion of the TCP to the PWB, alignment can be confirmed using a microscope; whereas, since the PWB does not transmit light, alignment cannot be confirmed using a microscope. Thus, a strong light is irradiated onto the base film to determine an alignment extent by a light reflected from the input pads. However, this method is complicated and unable to accurately determine an alignment. Also, such a method is time consuming.

SUMMARY OF THE INVENTION

Accordingly, it is an object of the present invention to provide a tape carrier package with a window for confirming an alignment extent with the naked eye and a liquid crystal display device containing the package, and an adhering method thereof.

In order to achieve these and other objects of the invention, a tape carrier package according to one aspect of the present invention includes a base film; an integrated circuit mounted on the base film; input pads connected to the integrated circuit to be formed on the base film; dummy pads formed at the side end of the input pads; and windows provided by removing the base film adjacent to the dummy pads into a desired size to expose at least two of said dummy pads.

A liquid crystal display device according to another aspect of the present invention comprises a liquid crystal panel; a printed wiring board including an output wiring for receiving image signals from the exterior thereof to output them to the liquid crystal panel, and a dummy wiring provided at the side ends of the output wiring; and a tape carrier package including input pads opposed to the output wiring of the printed wiring board, output pads corresponding to signal pads of the liquid crystal panel, dummy pads opposed to the dummy wiring of the printed wiring board at the side ends of the input pads, and windows defined by opening the base film to expose at least two of said dummy pads, said tape carrier package being adhered, via the input pad and the dummy pads, to the print wiring board and, via the output pads, to the liquid crystal panel.

In some embodiments of the invention, dummy pads are included on the printed wiring board and TCP. The dummy pads are exposed by the window in the tape carrier package to confirm alignment of the tape carrier package to the PWB. In other embodiments, no dummy pads are provided in the PWB/TCP. In these embodiments, only a portion of the signal pads are exposed by the window. Some or all of the pads on the TCP/PWB may be lengthened to compensate for portions exposed by the window. Of course, this arrangement can also be used even when dummy pads are present.

A method of jointly adhering a tape carrier package of a liquid crystal display device according to still another aspect of the present invention includes the steps of adhering input pads and dummy pads of the tape carrier package to a wiring of a printed wiring board to correspond to each other with an isotropic conductive film therebetween; and confirming an alignment of the dummy pads to the print wiring board with the aid of the windows.

BRIEF DESCRIPTION OF THE DRAWINGS

These and other objects of the invention will be apparent from the following detailed description of preferred embodiments of the present invention with reference to the accompanying drawings, in which.

DETAILED DESCRIPTION OF THE PREFERRED EMBODIMENT

Figure 1:
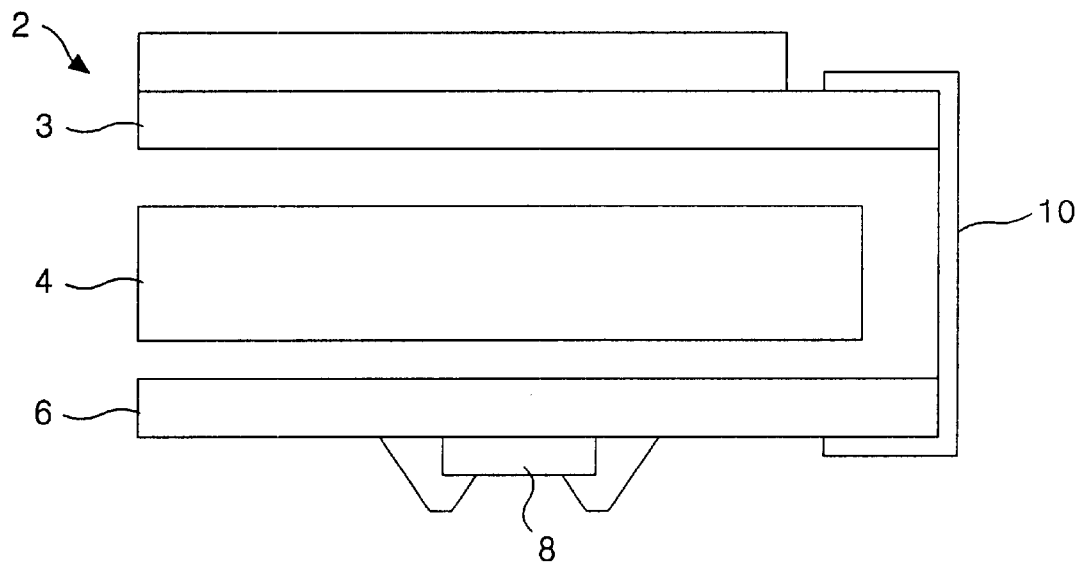
FIG. 1 is a sectional view showing an integrated circuit mounting method employing the conventional chip on board system.
Figure 2:
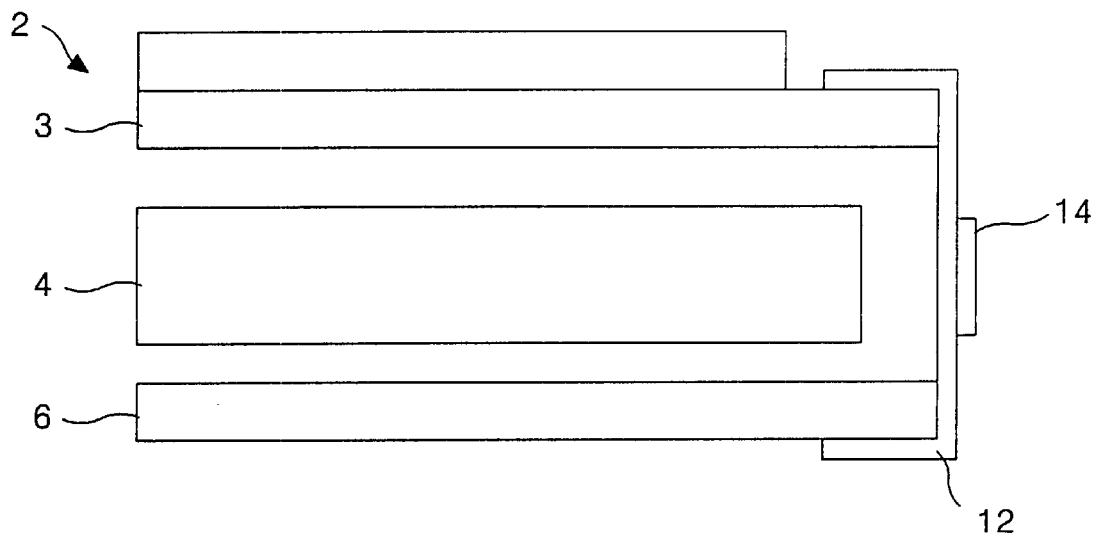
FIG. 2 is a sectional view showing an integrated circuit mounting method employing the conventional tape automated bonding system.
Figure 3:
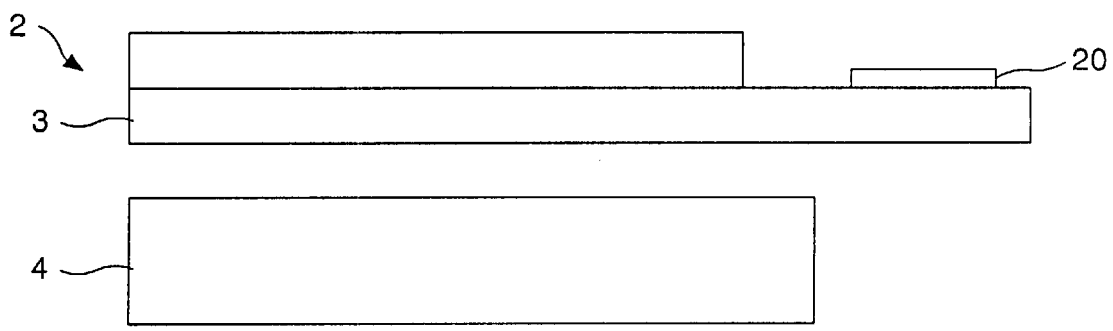
FIG. 3 is a sectional view showing a liquid crystal display device employing the conventional chip on glass system.
Figure 4:
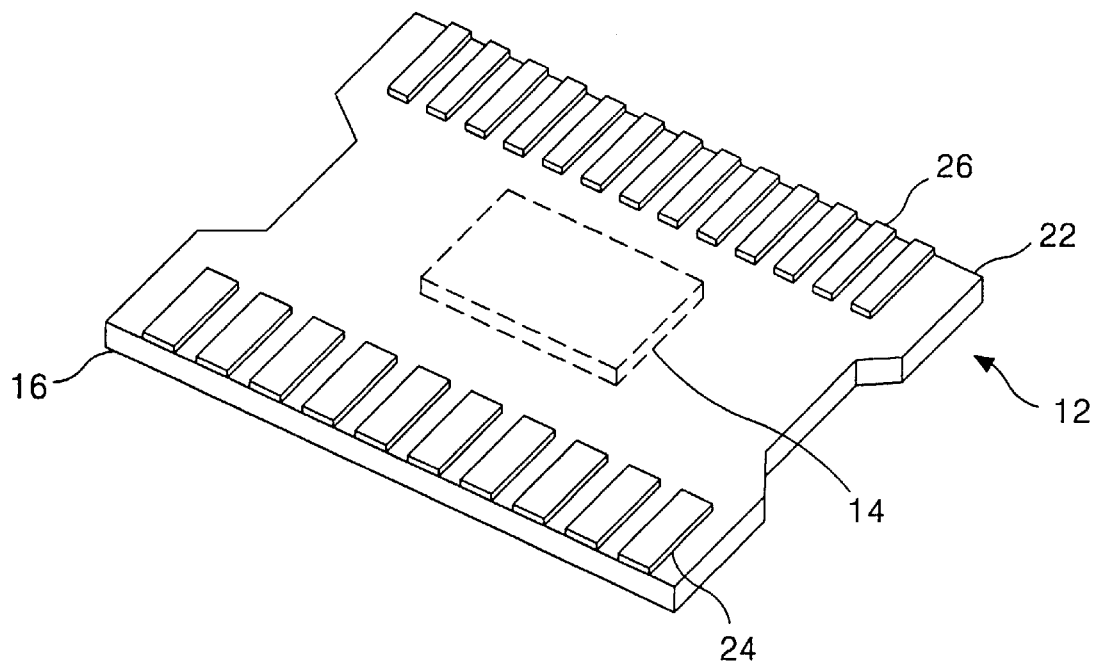
FIG. 4 is a detailed perspective view showing the structure of the tape carrier package in FIG. 2.
Figure 5A:
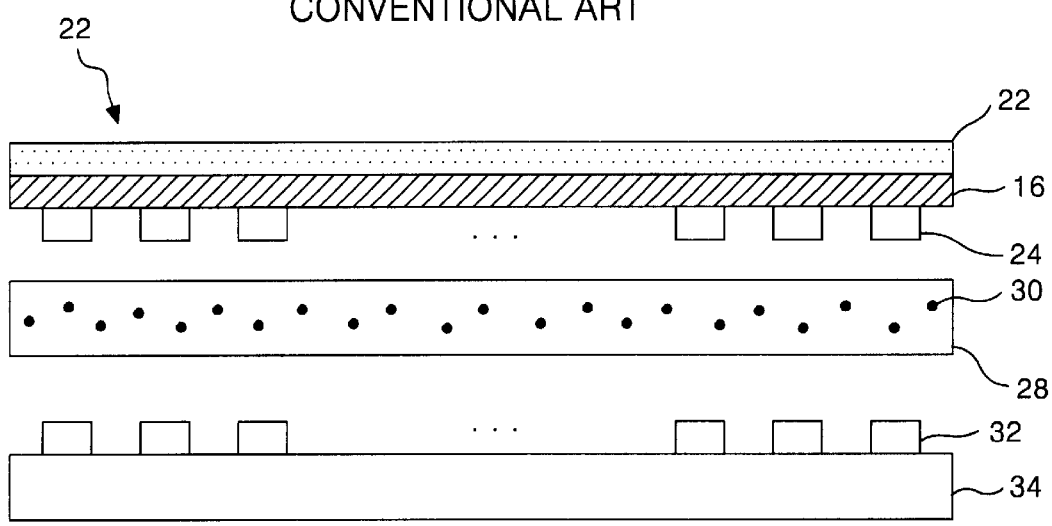
FIG. 5A and FIG. 5B are plan views showing a process of adhering the tape carrier package to the printed wiring board shown in FIG. 4.
Figure 5B:
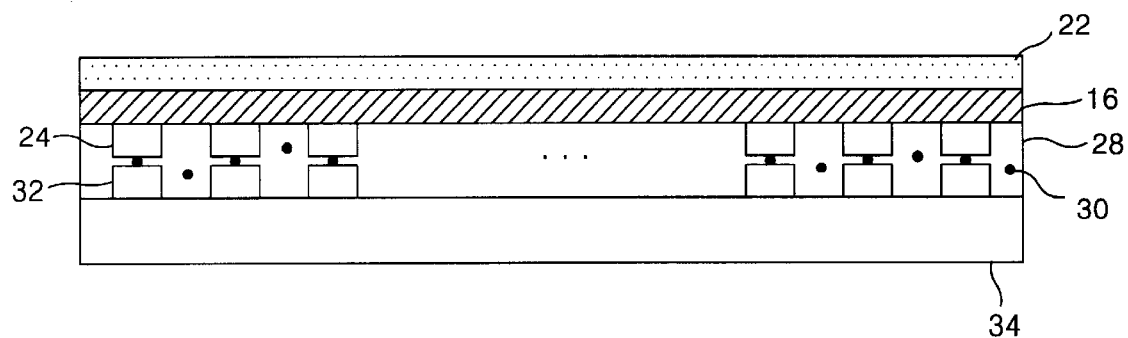
Figure 6:
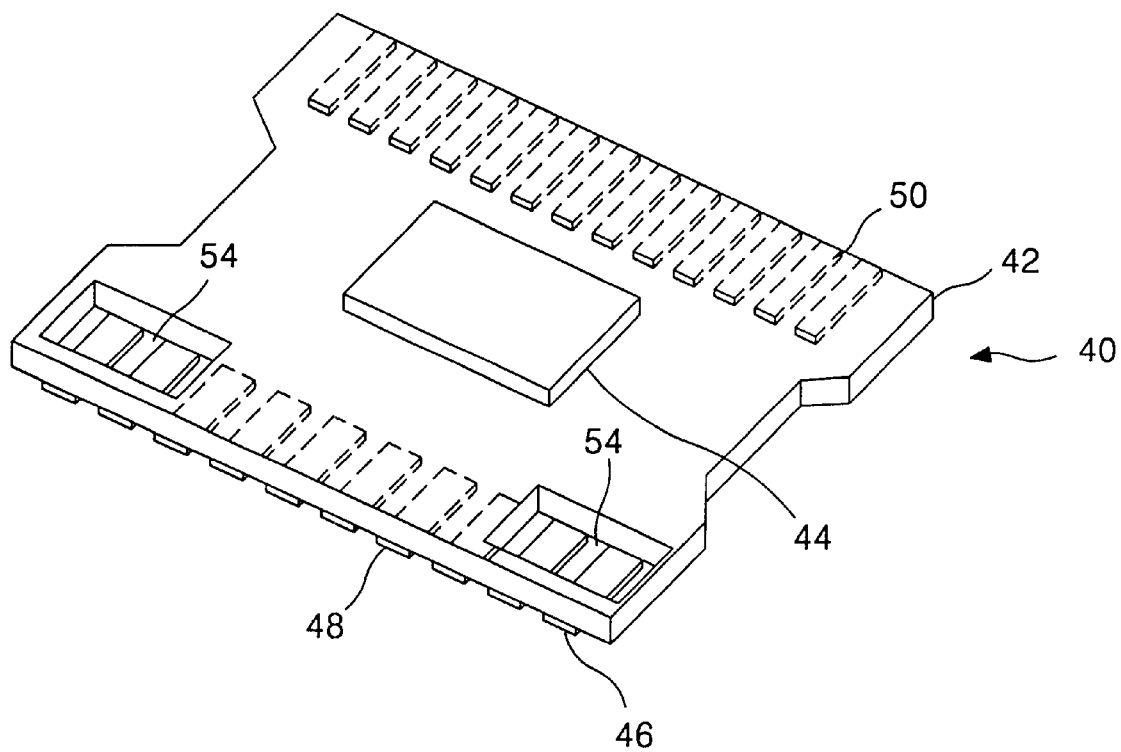
FIG. 6 is a detailed perspective view showing the configuration of a tape carrier package according to the present invention.
Figure 7A:
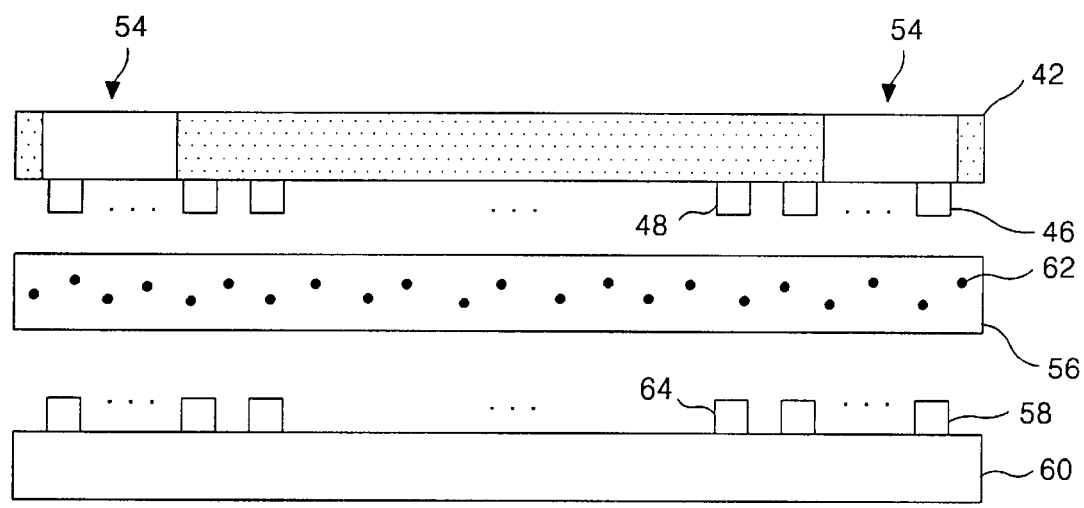
FIG. 7A and FIG. 7B are sectional views showing a process of adhering the tape carrier package to the printed wiring board shown in FIG. 6.

Referring to FIG. 6, there is shown a tape carrier package (TCP) according to an embodiment of the present invention. The TCP 40 includes a base film 42, ICs 44 mounted on the base film 42, input and output pads 48 and 50 connected to the input and output pins of the ICs 44 and formed on the base film 42, dummy pads 46 provided at the side end of the input pads 48, and windows 54 defined by openings in the base film 42 to confirm an alignment of the dummy pads 46. The input and output pads 48 and 50 have a two-layer structure in which copper(Cu) is plated with tin(Sn) for preventing oxidation, and are fixed onto the base film 42 with a bonding layer. For example, the dummy pads 46 are formed five by five at the left and right side of the input pads 48. The windows 54 are formed into a square shape by punching the base film 42 provided with the dummy pads 46. The windows 54 are punched into such a desired size that alignment between the first two or three dummy lines 46 can be confirmed with the naked eye. The dummy pads 46 that are provided with the window 54 prevent an alien substance from coming into contact with the input pads 48. As shown in FIG. 7A, the input pads 48 fixed onto the base film 42 are connected to the signal wiring 64 on the PWB 60 with the aid of the ACF 56. Likewise, the output pads 50 of the base film 42 are connected to data and gate pads on the liquid crystal panel with the aid of the ACF 56.

Figure 7B:
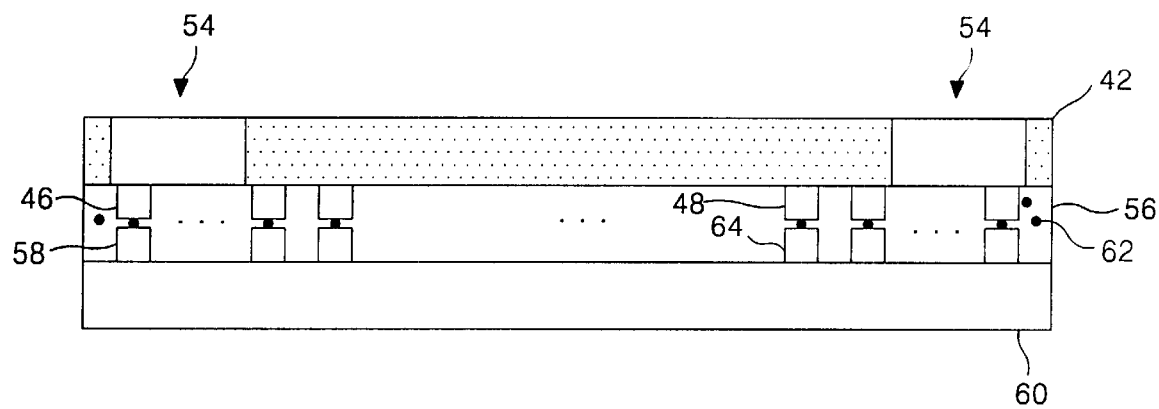

FIG. 7A and FIG. 7B show a process of adhering the TCP to the PWB. Referring to FIG. 7A and FIG. 7B, there is shown the ACF 56 for adhering the TCP 40 to the PWB 60. The PWB 60 is provided with the dummy wiring 58 corresponding to the dummy pads 46 formed at the TCP 40. The input pads 48 and the dummy lines 46 of the TCP 40 are provided after the windows 54 are formed on the base film 42.

Hereinafter, an adhesion process of the liquid crystal using the tape carrier package will be described in detail. After the ACF 56 has been coated on the PWB 60, the TCP 40 is jointly adhered to the PWB 60 as shown in FIG. 7B by applying a certain pressure thereto at a desired temperature. Since the conductive particles 62 contained in the ACF 56 between the input pads 48 and the dummy pads 46 of the TCP 40 and between the wiring 64 and the dummy wiring 58 of the PWB 60 have an increased density caused by the pressure, they connect the input pads 48 to the wiring 64 of the PWB 60 electrically. In this case, an alignment of the dummy pads 46 and the dummy wiring 58 is confirmed by means of the windows to check alignment errors.

As described above, according to the present invention, a desired size of windows are formed on the base film to confirm an alignment state between the tape carrier package and the print wiring board. Accordingly, the time required to check for misalignment can be dramatically shortened.

Although the present invention has been described in connection with the embodiments shown in the drawings described above, it should be understood by a person of ordinary skill in the art that the invention is not limited to these embodiments, but rather that various changes or modifications thereof are possible without departing from the spirit of the invention. Accordingly, the scope of the invention shall be determined only by the appended claims and their equivalents.

What is claimed is:

1. A tape carrier package, comprising:
   a base film having a first edge, a second edge, a front, a rear, a first side, and a second side, said base film further having a first window disposed along said first edge near said front and a second window disposed along said first edge near said rear;
   an electrically conductive pattern on said first side of said base film, said electrically conductive pattern having a plurality of first edge pads that extend inward from said first edge, wherein said plurality of first edge pads are for carrying electrical signals to and from external circuitry;
   a forward dummy pad that spans said first window; and
   a rear dummy pad that spans said second window.

2. A tape carrier package according to claim 1, further including an integrated circuit attached to said base film.

3. A tape carrier package according to claim 2, wherein said integrated circuit is attached to said second side.

4. A tape carrier package according to claim 2, wherein said integrated circuit is attached with a bonding layer.

5. A tape carrier package according to claim 1, further including at least one additional dummy pad disposed on said base film between said plurality of first edge pads and either the first window or the second window.

6. A tape carrier package according to claim 1, wherein said forward dummy pad and said rear dummy pad are uniformly spaced relative to the first edge pads.

7. A tape carrier package according to claim 1, wherein said conductive pattern is a two layer structure that includes a copper layer and an oxidation prevention layer.

8. A tape carrier package according to claims 1, wherein said forward and said rear dummy leads do not carry electrical signals.

9. A tape carrier package according to claim 1, wherein said first window and said second window are substantially square.

10. An electronic interconnection assembly, comprising:
   a circuit board having a plurality of linearly aligned circuit board pads for carrying electrical signals, said circuit board further having a plurality of dummy connectors disposed on both sides of said plurality of circuit board pads; and
   a tape carrier package having:
      a base film having a first edge, a second edge, a front, a rear, a first side, and a second side, said base film further having a first window disposed along said first edge near said front and a second window disposed along said first edge near said rear;
      an electrically conductive pattern on said first side of said base film, said electrically conductive pattern having a plurality of first edge pads that extend inward from said first edge and that align with and electrically connect to said circuit board pads; and
      a forward dummy pad that spans said first window and that aligns with a dummy connector on said circuit board;
      a rear dummy pad that spans said second window and that aligns with a dummy connector on said circuit board; and
      an integrated circuit on said base film.

11. An electronic interconnection assembly according to claim 10, wherein said integrated circuit is attached to said second side.

12. An electronic interconnection assembly according to claim 11, wherein said integrated circuit is attached with a bonding layer.

13. An electronic interconnection assembly according to claim 10, further including at least one additional dummy pad disposed on said base film between said plurality of first edge pads and either the first window or the second window.

14. An electronic interconnection assembly according to claim 10, wherein said forward dummy pad and said two rear dummy pad are uniformly spaced relative to the first edge pads.

15. An electronic interconnection assembly according to claim 10, wherein said plurality of first edge pads and said plurality of circuit board pads are electrically connected by an anisotropic conductive film.

16. An electronic interconnection assembly according to claim 10, wherein said forward and rear dummy leads do not carry electrical signals.

17. An electronic interconnection assembly according to claim 10, wherein said first window and said second window are substantially square.

18. A liquid crystal display device, comprising:
   a liquid crystal panel for producing an image in response to output signals applied to a plurality of liquid crystal pads;
   a circuit board having a plurality of circuit board pads for carrying input signals, said circuit board further having a plurality of dummy connectors disposed on both sides of said plurality of circuit board pads; and
   a tape carrier package having:
      a base film with a first edge, a second edge, a front, a rear, a first side, and a second side, said base film further includes a first window disposed along said first edge near said front and a second window disposed along said first edge near said rear;
      an electrically conductive pattern on said first side of said base film, said electrically conductive pattern having a plurality of input pads that extend inward from said first edge and that align with and electrically connect to said plurality of circuit board pads, said electrically conductive pattern further having a plurality of output pads that align with and electrically connect to said plurality of liquid crystal pads;
      a forward dummy pad that spans said first window and that aligns with a dummy connector on said circuit board;
      a rear dummy pad that spans said second window and that aligns with a dummy connector on said circuit board; and
      an integrated circuit on said base film, said integrated circuit for receiving input signals from said circuit board via said plurality of input pads, said integrated circuit further for converting said input signals to output signals, wherein said output signals are applied to said liquid crystal panel via said plurality of output pads.

19. A liquid crystal display device according to claim 18, wherein said integrated circuit is attached to said second side.

20. A liquid crystal display device according to claim 19, wherein said integrated circuit is attached with a bonding layer.

21. A liquid crystal display device according to claim 18, further including at least one additional dummy pad disposed on said base film between said plurality of first edge pads and either the first window or the second window.

22. A liquid crystal display device according to claim 18, wherein said two forward dummy pads and said two rear dummy pads are uniformly spaced along the first edge.

23. A liquid crystal display device according to claim 18, wherein said plurality of first edge pads and said plurality of circuit board pads are electrically connected by an anisotropic conductive film.

24. A liquid crystal display device according to claim 18, wherein said forward and said rear dummy leads do not carry electrical signals.

25. A liquid crystal display device according to claim 18, wherein said first window and said second window are substantially square.

* * * * *